US010263352B2

(12) United States Patent
Smith, Jr. et al.

(10) Patent No.: US 10,263,352 B2
(45) Date of Patent: Apr. 16, 2019

(54) ELECTRICAL CONTACT PAD FOR ELECTRICALLY CONTACTING A CONNECTOR

(71) Applicant: TE Connectivity Corporation, Berwyn, PA (US)

(72) Inventors: Graham Harry Smith, Jr., Mechanicsburg, PA (US); Scott Eric Walton, Mount Joy, PA (US); Michael Frank Cina, Elizabethtown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/617,767

(22) Filed: Jun. 8, 2017

(65) Prior Publication Data

US 2017/0358878 A1    Dec. 14, 2017

Related U.S. Application Data

(60) Provisional application No. 62/348,639, filed on Jun. 10, 2016.

(51) Int. Cl.

| | |
|---|---|
| *H05K 1/00* | (2006.01) |
| *H01R 12/71* | (2011.01) |
| *H01R 12/70* | (2011.01) |
| *H01R 13/6474* | (2011.01) |
| *H05K 1/11* | (2006.01) |

(Continued)

(52) U.S. Cl.
CPC ....... *H01R 12/714* (2013.01); *H01R 12/7005* (2013.01); *H01R 13/6474* (2013.01); *H05K 1/117* (2013.01); *H01P 5/028* (2013.01); *H01R 12/721* (2013.01); *H05K 1/025* (2013.01); *H05K 3/403* (2013.01); *H05K 2201/094* (2013.01); *H05K 2201/09381* (2013.01);

(Continued)

(58) Field of Classification Search
CPC ...................................... H05K 1/117
USPC .............. 439/59, 637, 607.07, 951
See application file for complete search history.

(56) References Cited

U.S. PATENT DOCUMENTS

| | | | |
|---|---|---|---|
| 3,223,960 A | 12/1965 | Ruehlemann | |
| 4,095,866 A * | 6/1978 | Merrill | .................... H05K 1/117 |
| | | | 174/262 |

(Continued)

FOREIGN PATENT DOCUMENTS

| | | |
|---|---|---|
| DE | 10 2007 002 202 A1 | 8/2007 |
| EP | 0 806 814 A2 | 11/1997 |

(Continued)

OTHER PUBLICATIONS

International Search Report, Application No. PCT/IB2017/053425, International Filing Date, Jun. 9, 2017.

*Primary Examiner* — Neil Abrams (57) ABSTRACT

An electrical contact pad for electrically contacting a connector includes a first region having a first length in a longitudinal direction, and a second region having a second length in the longitudinal direction that is greater than the first length. The first region is arranged to contact a first arm of the connector and the second region is arranged to contact a second arm of the connector. The first length being smaller than the second length results in a beneficial increases the impedance of the electrical contact pad. A chamfered edge of the contact pad results in an additional beneficial increase in the impedance of the electrical contact pad.

9 Claims, 6 Drawing Sheets

(51) Int. Cl.
*H01R 12/72* (2011.01)
*H01P 5/02* (2006.01)
*H05K 1/02* (2006.01)
*H05K 3/40* (2006.01)

(52) U.S. Cl.
CPC .............. *H05K 2201/09418* (2013.01); *H05K 2201/09427* (2013.01); *H05K 2201/09727* (2013.01)

(56) References Cited

U.S. PATENT DOCUMENTS

| | | | |
|---|---|---|---|
| 4,532,419 A * | 7/1985 | Takeda ................... | G06K 19/07 235/492 |
| 4,794,243 A * | 12/1988 | Hamada ........... | G06K 19/07743 235/492 |
| 5,024,609 A * | 6/1991 | Piorunneck .......... | H01R 12/721 439/60 |
| 5,093,640 A | 3/1992 | Bischof | |
| 6,142,790 A * | 11/2000 | Niitsu .................. | H01R 12/592 439/495 |
| 6,171,115 B1 | 1/2001 | Mickievicz et al. | |
| 6,267,604 B1 | 7/2001 | Mickievicz et al. | |
| 6,379,188 B1 | 4/2002 | Cohen et al. | |
| 6,655,966 B2 | 12/2003 | Rothermel et al. | |
| 6,663,442 B1 | 12/2003 | Helster et al. | |
| 6,803,656 B2 * | 10/2004 | Farnworth ............... | H01L 23/32 257/626 |
| 6,811,440 B1 | 11/2004 | Rothermel et al. | |
| 6,824,391 B2 | 11/2004 | Mickievicz et al. | |
| 6,899,546 B2 * | 5/2005 | Longueville ........... | H05K 1/117 439/260 |
| 7,044,794 B2 * | 5/2006 | Consoli ............. | H01R 13/6485 439/607.07 |
| 7,112,074 B2 * | 9/2006 | Nakai .................. | G06K 19/077 439/159 |
| 7,175,445 B2 | 2/2007 | Consoli et al. | |
| 7,232,315 B2 * | 6/2007 | Uchida ................ | H01R 12/721 439/492 |
| 7,245,503 B2 * | 7/2007 | Koga .................... | H01R 12/62 174/254 |
| 7,326,092 B2 | 2/2008 | Fedder et al. | |
| 7,359,204 B1 * | 4/2008 | Jang ....................... | G06K 19/07 235/492 |
| 7,399,192 B2 * | 7/2008 | Yamamoto ............. | H01R 12/79 439/260 |
| 7,771,205 B2 * | 8/2010 | Shiramizu .............. | H05K 1/117 439/60 |
| 8,102,657 B2 * | 1/2012 | Hiew .................... | G06F 1/1632 361/737 |
| 8,143,527 B2 * | 3/2012 | Lo ........................... | H05K 1/118 174/254 |
| 8,157,592 B2 * | 4/2012 | Mizukami .......... | H01R 13/6587 439/607.07 |
| 8,157,598 B2 * | 4/2012 | Niitsu ...................... | H05K 3/32 439/620.22 |
| 8,550,861 B2 | 10/2013 | Cohen et al. | |
| 8,641,453 B2 * | 2/2014 | Jung ...................... | H05K 1/117 439/637 |
| 8,727,791 B2 | 5/2014 | Gulla | |
| 8,951,048 B2 * | 2/2015 | Seok ...................... | H05K 1/117 439/59 |
| 8,998,620 B2 * | 4/2015 | Ni .......................... | H01R 12/71 361/737 |
| 9,017,114 B2 | 4/2015 | Cohen et al. | |
| 9,033,750 B2 | 5/2015 | Miller et al. | |
| 9,055,684 B2 * | 6/2015 | Xie ........................ | H05K 1/117 |
| 9,173,292 B1 | 10/2015 | Sokol et al. | |
| 9,190,745 B2 | 11/2015 | Gulla | |
| 9,300,066 B2 * | 3/2016 | Venaleck ............. | H05K 1/0256 |
| 9,549,469 B2 * | 1/2017 | Beaman ................ | H05K 1/117 |
| 9,559,445 B2 * | 1/2017 | Wig ...................... | H01R 12/7005 |
| 9,997,868 B1 * | 6/2018 | Smith, Jr. .......... | H01R 13/6461 |
| 10,128,597 B2 * | 11/2018 | Smith, Jr. ............. | H01R 12/721 |
| 2004/0180562 A1 | 9/2004 | Raistrick et al. | |
| 2006/0014433 A1 | 1/2006 | Consoli et al. | |
| 2006/0172566 A1 | 8/2006 | Nakajima et al. | |
| 2007/0270040 A1 * | 11/2007 | Jang ................... | G06K 19/077 439/660 |
| 2009/0233459 A1 | 9/2009 | Shiramizu et al. | |
| 2010/0096165 A1 | 4/2010 | Lo et al. | |
| 2014/0308852 A1 | 10/2014 | Gulla | |
| 2014/0329414 A1 | 11/2014 | Cohen et al. | |
| 2015/0049444 A1 | 2/2015 | Venk et al. | |
| 2015/0129284 A1 | 5/2015 | Aparimarn et al. | |
| 2015/0359082 A1 | 12/2015 | Nishimura et al. | |
| 2017/0358878 A1 * | 12/2017 | Smith, Jr. .......... | H01R 12/7005 |
| 2017/0358881 A1 * | 12/2017 | Smith, Jr. ............. | H01R 12/721 |

FOREIGN PATENT DOCUMENTS

| | | |
|---|---|---|
| EP | 1 545 170 A1 | 12/2004 |
| EP | 1 940 207 A2 | 7/2008 |
| EP | 2 091 307 A1 | 8/2009 |
| EP | 2 775 732 A1 | 10/2014 |
| WO | 2015 029942 A1 | 3/2015 |

* cited by examiner

ELECTRICAL CONTACT PAD FOR ELECTRICALLY CONTACTING A CONNECTOR

RELATED APPLICATIONS

This application claims the benefit of priority to U.S. Provisional Application No. 62/348,639, filed Jun. 10, 2016, the content of which is hereby incorporated by reference in its entirety.

BACKGROUND

I. Field

The present invention relates generally to electrical connectors. More specifically, the present invention relates to an electrical contact pad for electrically contacting a connector.

II. Description of Related Art

Some electrical systems incorporate a number of electrical modules that are interconnected with one another via a backplane circuit board. Connectors on the modules facilitate insertion of the modules into complementary connectors on the backplane.

Each connector may be configured to couple one or more signals between the electrical module and the backplane. Signals transferred via the connector may be relatively high-frequency signals. Special care must be taken in the construction of the connector to minimize degradation of any signals communicated over the connector.

SUMMARY

In one aspect, an electrical contact pad for electrically contacting a connector includes a first region having a first length in a longitudinal direction, and a second region having a second length in the longitudinal direction that is greater than the first length. The first region is arranged to contact a first arm of the connector and the second region is arranged to contact a second arm of the connector. The first length being smaller than the second length results in a beneficial increases the impedance of the electrical contact pad.

In a second aspect, an electrical contact pad for electrically contacting a connector includes a first edge region connected to a trace, and an opposing edge region having a chamfered corner. The chamfered corner results in a beneficial increase of the impedance of the electrical contact pad.

In a third aspect, an electrical connector includes a bottom housing; a plurality of circuit wafers disposed within the bottom housing; and a shroud that forms a top of the electrical connector that is configured to engage the bottom housing to secure the plurality of circuit wafers between the bottom housing and the shroud. The plurality of circuit wafers include one or more contact pads. At least one contact pad includes a first region having a first length in a longitudinal direction; and a second region having a second length in the longitudinal direction that is greater than the first length. The first region is arranged to contact a first arm of the connector and the second region is arranged to contact a second arm of the connector. The first length being smaller than the second length increases an impedance of the electrical contact pad.

DETAILED DESCRIPTION

Figure 1:
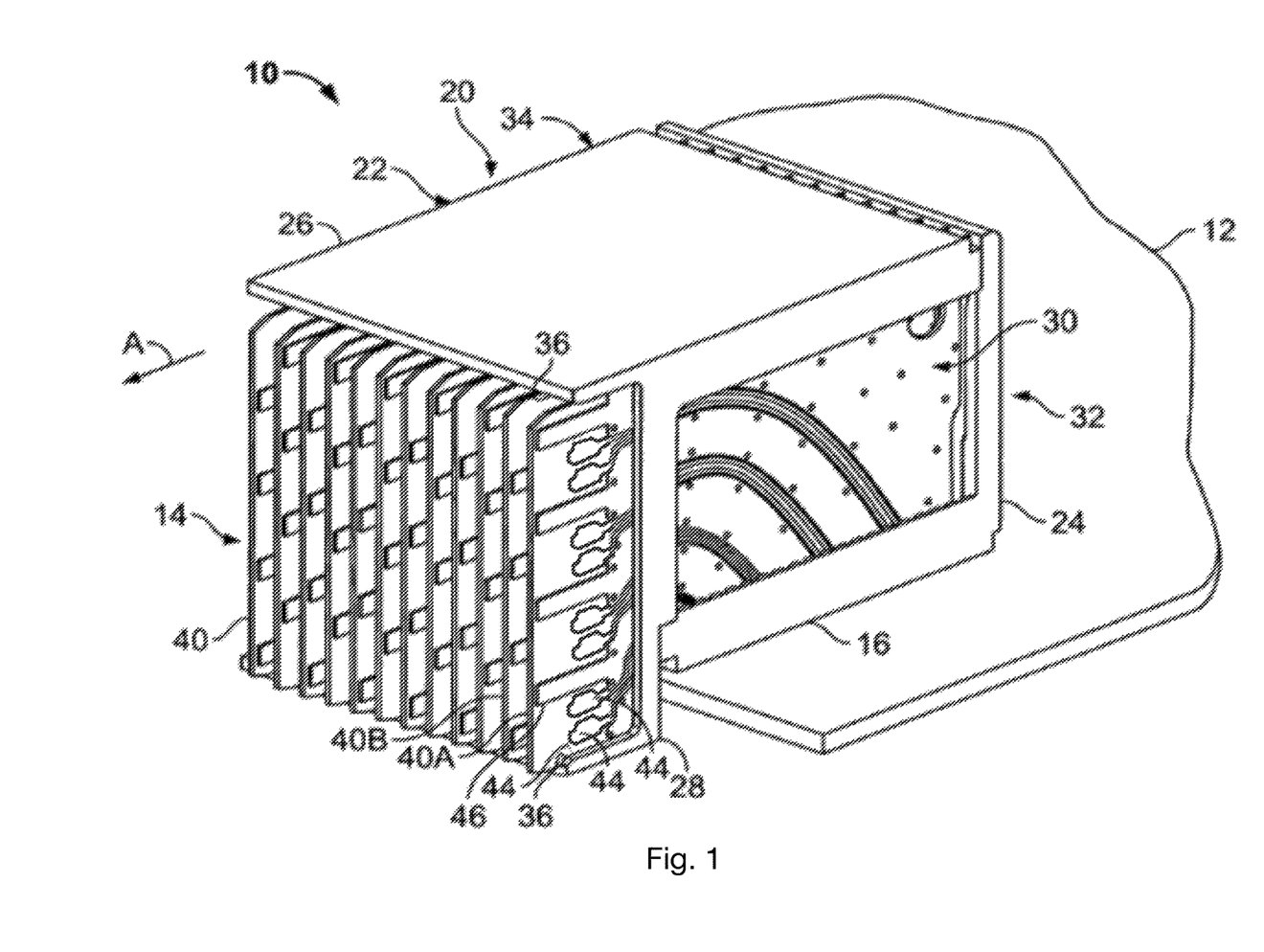
FIG. 1 illustrates a perspective view of an electrical connector formed in accordance with an exemplary embodiment that houses a plurality of the exemplary wafers.

FIG. 1 illustrates a perspective view of an electrical connector 10 formed in accordance with an exemplary embodiment. The electrical connector 10 may be one of many disposed on a specialized circuit module to facilitate electrically coupling signals on the circuit module with other circuit modules via a backplane circuit board of a product such RF test equipment and the like.

The connector 10 may correspond to a receptacle connector that is configured to be mounted on a circuit board 12 which in an exemplary embodiment is a daughter board. The connector 10 has a mating face 14 and a mounting face 16 that includes an interface for mounting the connector 10 to the circuit board 12. In an exemplary embodiment, the mounting face 16 is substantially perpendicular to the mating face 14 such that the receptacle connector 10 interconnects electrical components that are substantially at a right angle to each other. The mating face 14 of the connector 10 defines a backplane connector interface. In one embodiment, the connector 10 may be used to interconnect a daughter board to a backplane circuit board. In other embodiments, the connector 10 may be configured to interconnect electrical components that are at other than a right angle to each other.

The connector 10 includes a dielectric housing 20 that has an upper housing portion 22 and a lower housing portion 24. The upper housing 22 includes upper and lower shrouds 26 and 28, respectively, that are proximate the mating face 14 of the connector 10. Upper shroud 26 and lower shroud 28 extend forwardly from upper housing 22 in the direction of arrow A, which is also the mating direction of the connector 10. The housing 22 includes end openings 30 at a first end 32 and a second end 34. The upper housing 22 and lower housing 24 are coupled together, forming an open framework for holding a plurality of wafers 40 that are received into the housing 20 with a card edge connection. The upper shroud 26 and lower shroud 28 each include a plurality of slots 36 that position and align the wafers 40 to facilitate mating with a mating connector (not shown).

The wafers 40 include signal contact pads 44 and ground contact pads 46, which may have a configuration that corresponds to the configuration of the various contact pad embodiments described above.

The ground contact pads 46 have a length measured in the direction of arrow A that is greater than a corresponding length of the signal contact pads 44. In one embodiment, the connector 10 is a high-speed connector that carries differential signals, and the signal contact pads 44 and ground contact pads 46 are arranged in an alternating pattern wherein pairs of signal contact pads 44 are separated by a ground contact pad 46. For instance, the wafer 40A starts with a ground contact pad 46 adjacent the upper shroud 26 and ends with a pair of signal contact pads 44 adjacent the lower shroud 28, whereas the adjacent wafer 408 begins with a pair of signal contact pads 44 adjacent the upper shroud 26 and ends with a ground contact pad 46 adjacent the lower shroud 28. Due to their shorter lengths, the signal contact pads 44 on the wafer 408 may be hidden by the wafer 40A in FIG. 1. However, the alternating nature of the pattern is revealed by the positioning of the ground contact pads 46. The pattern of signal and ground contact pads alternates from wafer to wafer in the connector 10. The connector 10 is modular in construction and, in the embodiment shown in FIG. 1, includes twelve wafers 40 with a total of 48 differential signal pairs of contact pads. It is to be understood, however, that in alternative embodiments, a greater or fewer number of the wafers 40 may be used. The wafers 40 project from the shrouds 26 and 28 and may be vulnerable to damage from an electrostatic discharge (ESD). One purpose of the ground contact pads 46 is to provide ESD protection for the signal contact pads 44.

Figure 2:
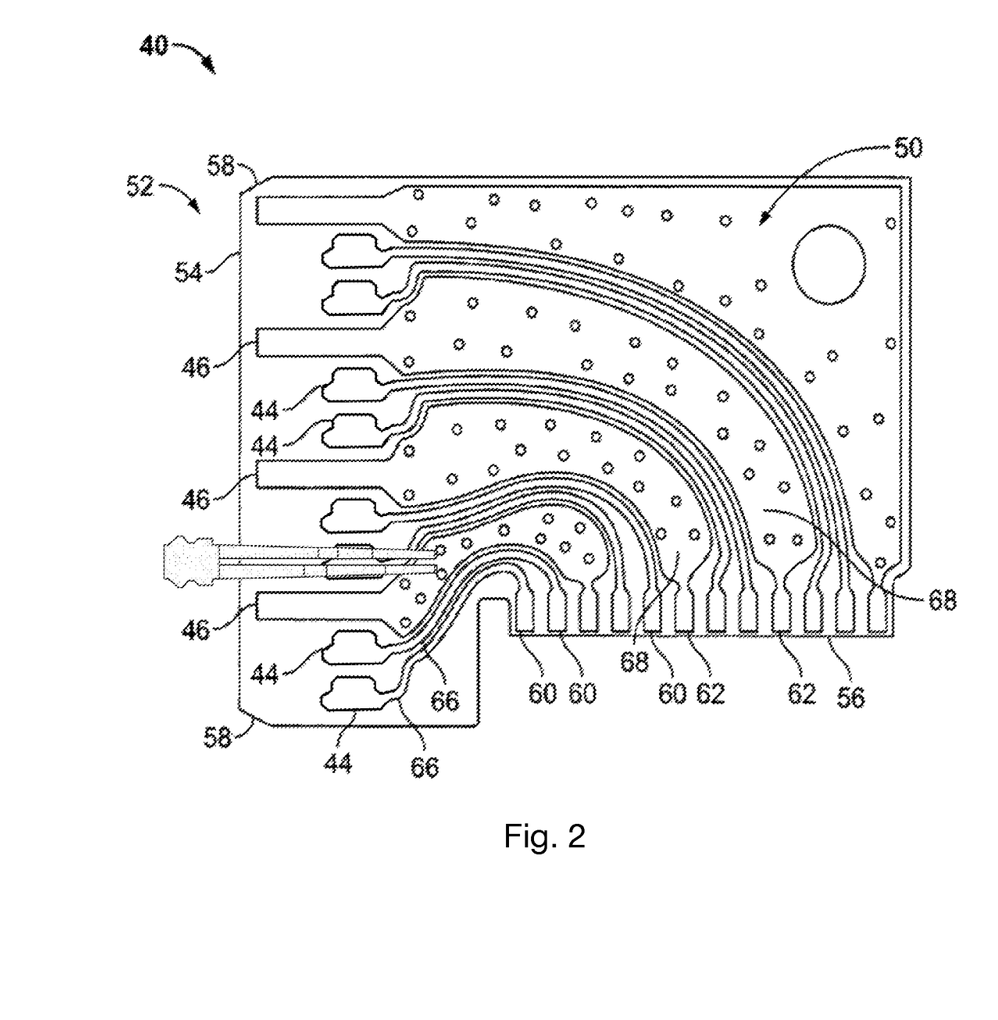
FIG. 2 is a front view of an exemplary wafer illustrating a wafer first side that may include one or more of the exemplary contact pad implementations described below.

FIG. 2 is a front view of an exemplary wafer 40 illustrating a wafer first side 50. The wafer 40 includes a mating end 52 that has a forward mating edge or backplane edge 54. The mating end 52 is configured to mate with a mating connector which may be a backplane connector (not shown). The wafer 40 also includes a mounting edge or daughter board edge 56 that is received in the lower housing 24 (FIG. 1) at the interface with the circuit board 12 (FIG. 1). The mounting edge 56 is substantially perpendicular to the mating edge 54. The wafer 40 has chamfered corners 58 at the mating end 52 to facilitate the mating process with the mating connector.

In an exemplary embodiment, the wafer 40 is a printed circuit board wafer. The wafer 40 includes a number of signal and ground contact pads 44 and 46, respectively, arranged along the mating edge 54 and a number of signal contact pads 60 and ground contact pads 62 along the mounting edge 56.

Due to their shorter length, the signal contact pads 44 are recessed rearward from the wafer mating edge 54 with respect to the ground contact pads 46. Conductive signal traces 66 interconnect the signal contact pads 44 and 60 on the mating edge and mounting edge 54 and 56, respectively. Ground contact traces 68 interconnect the ground contact pads 46 at the mating edge 54 of the wafer 40 with ground contact pads 62 at the mounting edge 56. However, there need not be a strict one-to-one relationship between ground contact pads 46 and 62. The wafer 40 has contact pads 44, 46, 60, and 62 and signal traces 66 only on the first side 50.

Figure 4:
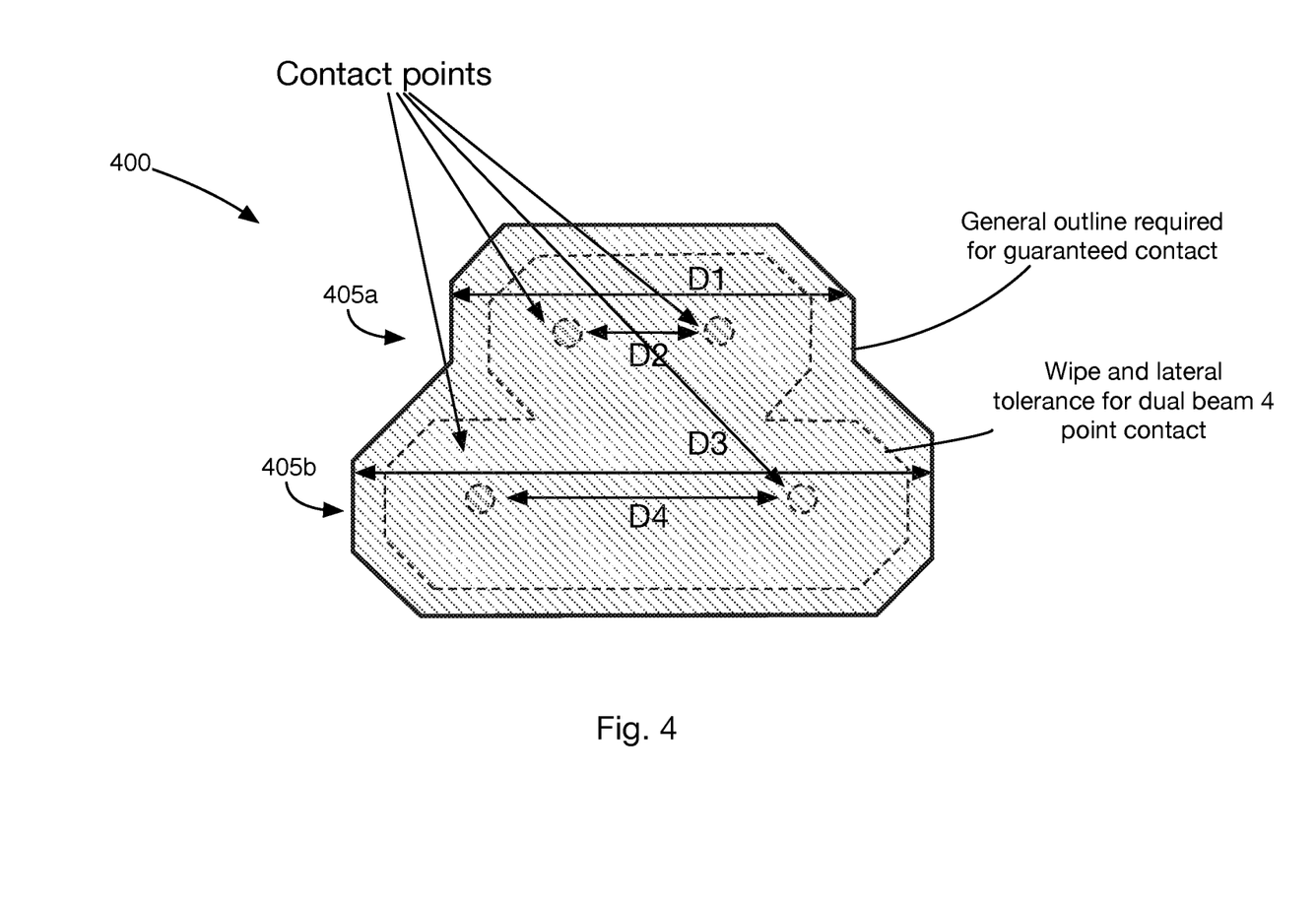
FIG. 4 illustrates a first exemplary contact pad implementation that may be utilized with the connector in FIGS. 3A and 3B.
Figure 5:
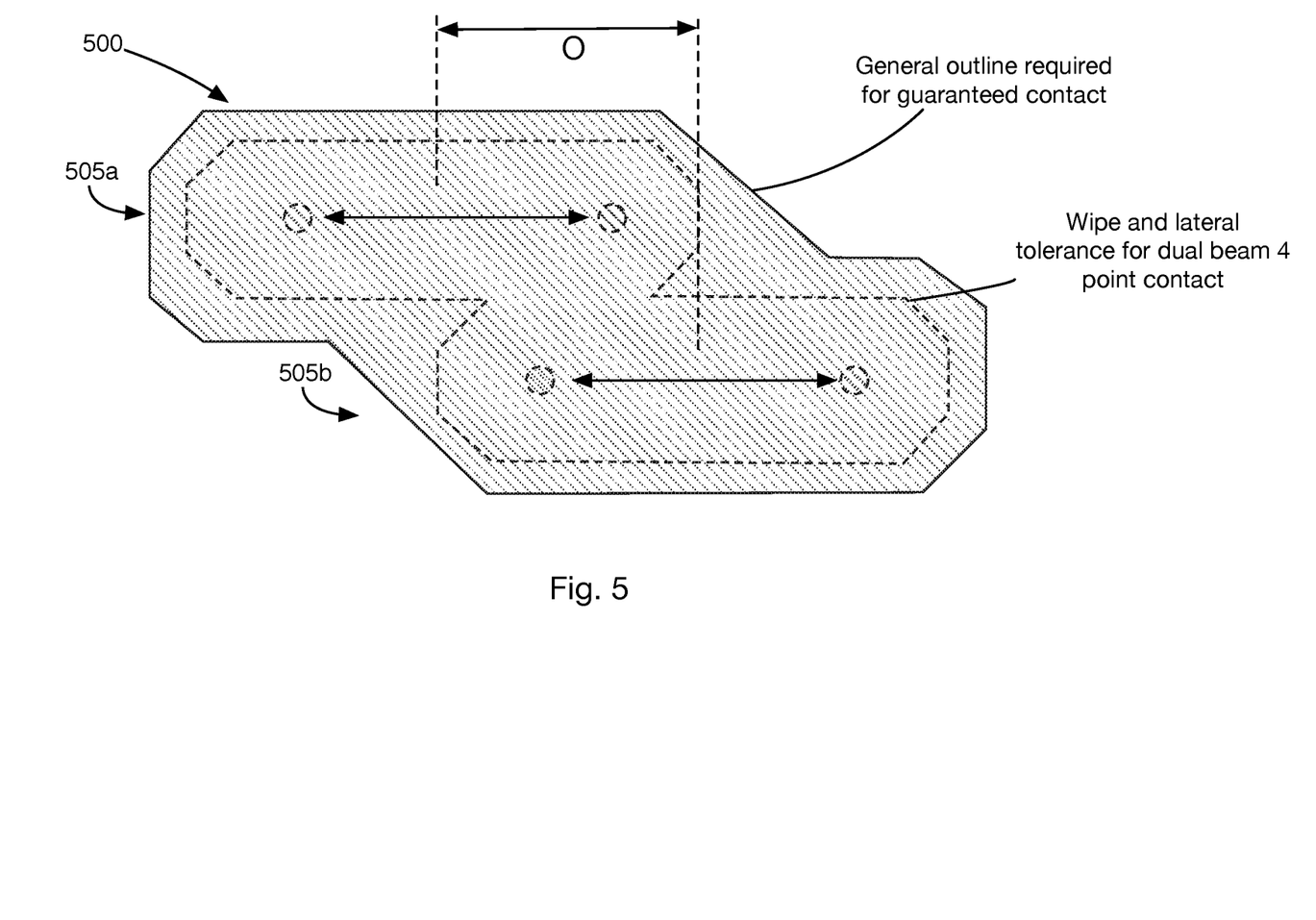
FIG. 5 illustrates a second exemplary contact pad implementation that may be utilized with the connector in FIGS. 3A and 3B.
Figure 6:
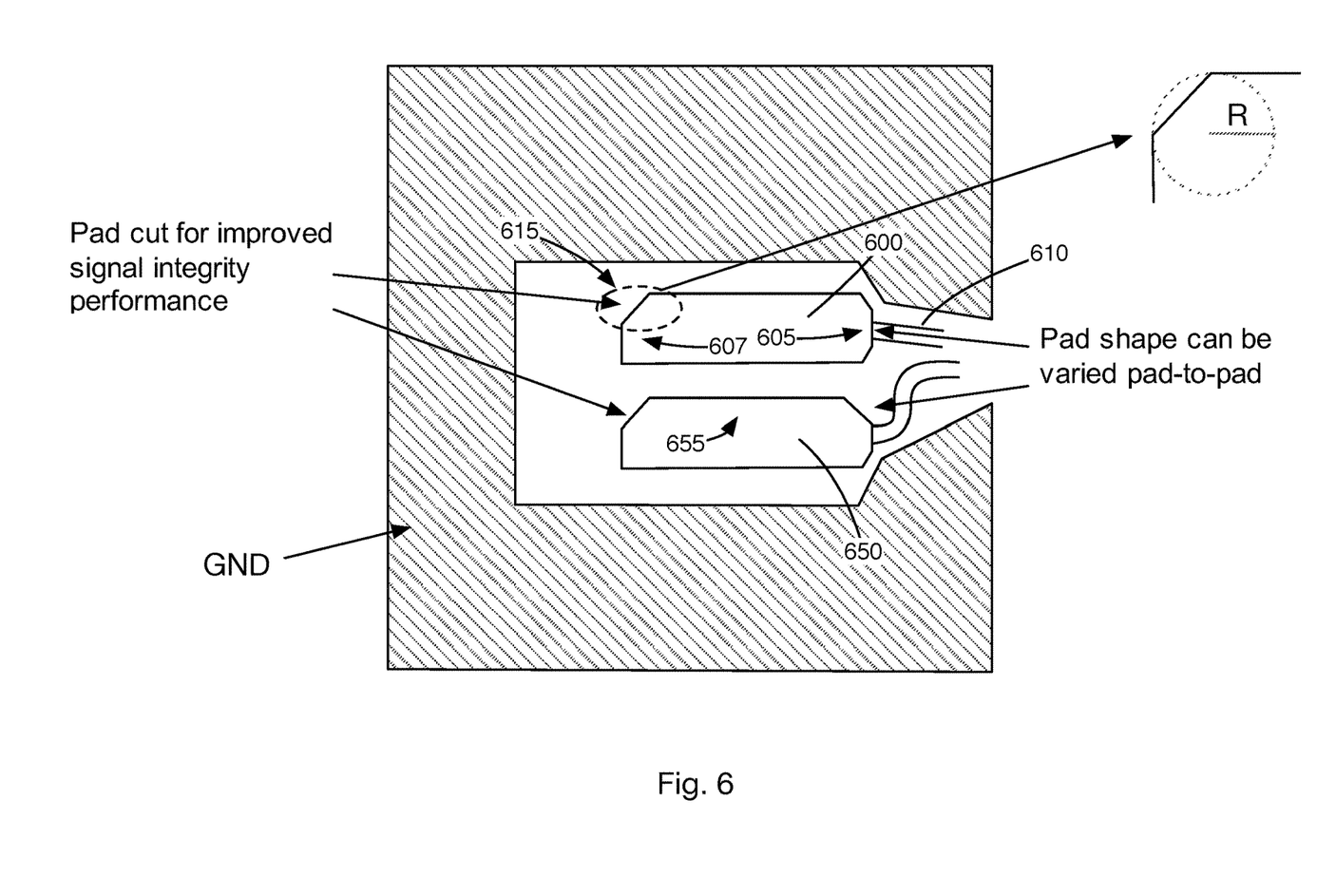
FIG. 6 illustrates a third exemplary contact pad implementation that may be utilized with the connector in FIGS. 3A and 3B.

While the contact pads 44 and 46 are illustrated as having generally rectangular shapes, in various preferred embodiments, the contact pads 44 and 46 may have an asymmetrical contact area and may have a generally asymmetrical shape to improve the impedance characteristics of the contact pads, as illustrated in FIGS. 4, 5, and 6.

Figure 3A:
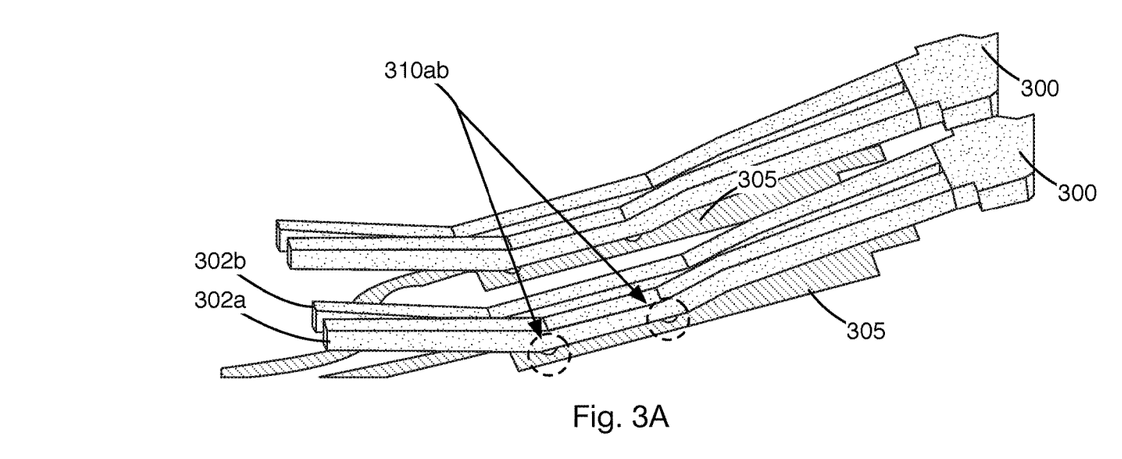
FIGS. 3A and 3B are perspective and top views, respectively, of an electrical connector resting upon a contact pad.
Figure 3B:
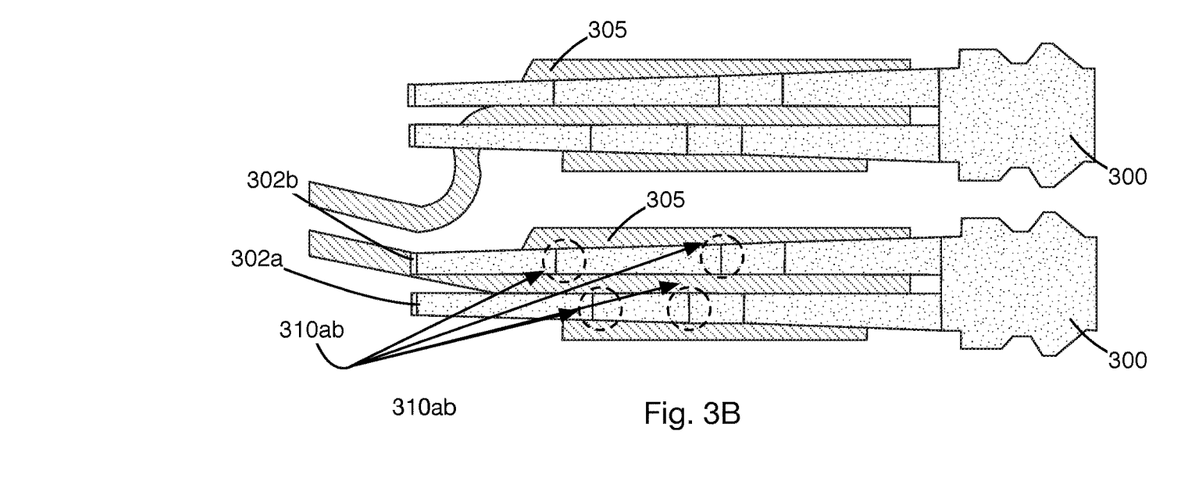

FIGS. 3A and 3B are perspective and top views, respectively, of electrical connectors 300 resting upon a contact pad 305. Each electrical connector 300 includes a pair of contact arms 302a,b. Each arm 302a,b includes a pair of contact points 310a,b of which the contact points 310a,b of a first contact arm 302b are illustrated. As more clearly shown in FIG. 3B, the spacing between the contact points 310a,b of the first contact arm 302a is less than the spacing between the contact points 310a,b of the second contact arm 302b, though the spacing may be the same in some implementations.

FIG. 4 illustrates a first exemplary contact pad embodiment 400 that may be utilized with the connector above. The contact pad 400 may include a first region 405a having a first length, D1, of between about 3.3 mm in a longitudinal direction of the contact pad 400, and a second region 405b having a second length, D3, of about 4.1 mm in the longitudinal direction. The second length, D3, may be greater than the first length, D1. In the exemplary implementation, the first region 405a is arranged to contact the first arm 302a of the connector 300, and the second region 405b is arranged to contact the second arm 302b of the connector 300.

The length, D1, of the first region 405a may be selected to facilitate contact with the two points of the first contact arm 302a, illustrated in FIG. 3A. The two points may be separated by a distance, D2, of about 1.1 mm. The length, D1, may be selected to be just large enough to accommodate variability in the location at which the points of the first contact arm 302a may contact the first region. For example, D1 may be 200% larger than D2. Likewise, the length, D3, of the second region 405b may be selected to facilitate contact with the two points of the second contact arm 302b. The two points of the second arm 302b may be separated by a distance, D4, of about 1.9 mm. In some implementations, distance D2 may be smaller than distance D4. Thus, as illustrated, the regions may be sized accordingly to minimize the surface area of the contact pad as opposed to a traditional contact pad having a rectangular shape designed to make contact with all four points of the connector. This reduced surface area of the improved contact pad 400 beneficially lowers the impedance of the contact pad 400 which in turn improves the impedance and frequency response characteristics at the location of the contact pad 400.

FIG. 5 illustrates a second exemplary contact pad implementation 500 that may be utilized with a connector above having two contact arms. As illustrated, the contact pad 500 may include first and second regions 505a,b for contacting contact points of the arms of the connector. In the second implementation, the longitudinal lengths of the two regions 505a,b may be the same or different. In addition, the center axis of the two regions 505a,b may be offset from one another by a distance, O, of about 1.0 mm. Thus, as illustrated, the regions may be sized accordingly to minimize the surface area of the contact pad. The reduced surface area of the improved contact pad beneficially lowers the impedance of the contact pad 500 which, in turn, improves the impedance and frequency response characteristics at the location of the contact pad 500.

FIG. 6 illustrates an exemplary implementation of a differential pair of contact pads 600 and 650, placed adjacent to one another, that may be utilized with a pair of the above-described connectors. The first contact pad 600 includes a first edge region 605 connected to a trace 610. An opposing edge region 607 includes a chamfered corner 615. The radius, R, of the chamfered corner 615 may be about 4 times the radius of the other corners of the electrical pad, which may be less than about 0.4 mm. In this case, the radius, R, of the chamfered corner may be less than about 1.6 mm. Applicant unexpectedly found that when the side of the contact pad 600 nearest the ground layer and opposite the trace side edge is chamfered, as illustrated, the impedance between the contact pads increases from 90Ω with no chamfering to 94Ω with chamfering, where an impedance of 100 ohms for the particular application was considered ideal.

In some implementations, the second contact pad 650 may chamfered on the edge 655 of the contact pad 650 nearest the first contact pad 600 at one or both ends, as illustrated. Applicant unexpectedly found that this modification further increases the impedance between the first connector 600 and the second connector 650.

While the chamfered edges are illustrated as being similar on the respective contact pads 600 and 650, the amount of chamfering may be different between the contact pads 600 and 650 and/or adjusted to obtain a desired impedance between the contact pads 600 and 650.

While the connector has been described with reference to certain embodiments, it will be understood by those skilled in the art that various changes may be made and equivalents may be substituted without departing from the spirit and scope of the claims of the application. For example, while the invention will be described in terms of a connector carrying differential signals, it is to be understood that modifications described herein can be applied in other situations where optimization of impedance is important. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. A circuit board wafer disposed within a first portion of a connector for communicating signals to resilient contact members disposed within a second portion of the connector, the circuit board wafer comprising:
   a plurality of electrical contact pads arranged side-by-side, wherein each contact pad includes:
      a first region having a first length in a longitudinal direction; and
      a second region having a second length in the longitudinal direction that is greater than the first length, wherein
         the first and second regions are centered longitudinally with one another,
         the first region is arranged to contact a first arm of a contact member and the second region is arranged to contact a second arm of the contact member, and
         the first length is smaller than the second length to thereby increase an impedance of the electrical contact pad, and
   wherein the first region of a first electrical contact pad is disposed adjacent to the second region of a second electrical contact pad.

2. The electrical contact pad according to claim 1, wherein the first length is selected to facilitate contact with two points of the first arm, which are separated by a first distance, and the second length is selected to facilitate contact with two points of the second arm, which are separated by a second distance that is greater than the first distance.

3. The electrical contact pad according to claim 2, wherein the first length of the first region is greater than the first distance, and the second length of the second region is greater than the second distance.

4. A circuit board wafer disposed within a first portion of a connector for communicating signals to resilient contact members disposed within a second portion of the connector, the circuit board wafer comprising:
   a plurality of electrical contact pads arranged side-by-side, wherein each contact pad includes:
      a first edge connected to a trace;
      a second edge opposite the first edge at an end of the contact pad;
      first and second side edges extending between the first and second edges, wherein a corner between the second edge and one of the side edges is chamfered to thereby increase of an impedance of the electrical contact pad.

5. The circuit board wafer according to claim 4, wherein a radius of the chamfered corner is about 1.6 mm and a radii of other corners of the electrical pad are less than about 0.4 mm.

6. The circuit board wafer according to claim 4, wherein a corner of the first edge region of a first electrical contact pad is chamfered on a side nearest the second electrical contact pad.

7. An electrical connector comprising:
   a bottom housing;
   a plurality of circuit wafers disposed within the bottom housing; and
   a shroud that forms a top of the electrical connector that is configured to engage the bottom housing to secure the plurality of circuit wafers between the bottom housing and the shroud,
   wherein the plurality of circuit wafers include one or more contact pads, wherein at least one contact pad includes:
      a first region having a first length in a longitudinal direction; and
   a second region having a second length in the longitudinal direction that is greater than the first length,
   wherein the first region is arranged to contact a first arm of the connector and the second region is arranged to contact a second arm of the connector, and
   wherein the first length being smaller than the second length increases an impedance of the electrical contact pad.

8. The electrical connector according to claim 7, wherein the first length is selected to facilitate contact with two points of the first arm, which are separated by a first distance, and the second length is selected to facilitate contact with two points of the second arm, which are separated by a second distance that is greater than the first distance.

9. The electrical connector pad according to claim 8, wherein the first length of the first region is greater than the first distance, and the second length of the second region is greater than the second distance.

* * * * *